United States Patent
Trautenberg

(10) Patent No.: US 7,376,096 B2
(45) Date of Patent: May 20, 2008

(54) PROCESS FOR INTERLEAVING NAVIGATION DATA

(75) Inventor: Hans L. Trautenberg, Neumarkt (DE)

(73) Assignee: Astrium GmbH, Munich (DE)

( * ) Notice: Subject to any disclaimer, the term of this patent is extended or adjusted under 35 U.S.C. 154(b) by 854 days.

(21) Appl. No.: 10/426,969

(22) Filed: May 1, 2003

(65) Prior Publication Data

US 2004/0037252 A1    Feb. 26, 2004

(30) Foreign Application Priority Data

May 2, 2002    (DE) ................. 102 19 701

(51) Int. Cl.
*H04B 7/212*    (2006.01)

(52) U.S. Cl. .............. 370/324; 370/336; 370/321; 455/3.02

(58) Field of Classification Search ........ 370/310–350, 370/441, 470; 455/12.1, 13.4
See application file for complete search history.

(56) References Cited

U.S. PATENT DOCUMENTS

| | | | |
|---|---|---|---|
| 6,052,386 A * | 4/2000 | Achilleoudis et al. ...... | 370/470 |
| 6,101,178 A | 8/2000 | Beal | |
| 6,370,666 B1 | 4/2002 | Lou et al. | |
| 6,434,170 B1 * | 8/2002 | Movshovich et al. ....... | 370/536 |
| 6,496,508 B1 * | 12/2002 | Breuckheimer et al. .... | 370/397 |
| 6,816,782 B1 * | 11/2004 | Walters et al. .............. | 701/209 |
| 7,058,027 B1 * | 6/2006 | Alessi et al. ............. | 370/310.1 |
| 2006/0007950 A1 * | 1/2006 | Okumura et al. ........... | 370/441 |

FOREIGN PATENT DOCUMENTS

| | | |
|---|---|---|
| DE | 19842039 | 4/2000 |
| EP | 1030463 | 8/2000 |
| EP | 1032231 | 8/2000 |
| WO | WO 00/74295 | 12/2000 |

OTHER PUBLICATIONS

European Search Report dated Nov. 22, 2005.

* cited by examiner

*Primary Examiner*—Charles N. Appiah
*Assistant Examiner*—Amancio González
(74) *Attorney, Agent, or Firm*—Crowell & Moring LLP

(57) ABSTRACT

A process, a satellite navigation system and a user terminal for furnishing and transmitting navigation data in a navigation system by transmitting several navigation data blocks from a navigation data transmission unit to navigation terminals. Before transmitting the navigation data to the navigation device, an interleaving of at least two navigation data blocks takes place.

17 Claims, 1 Drawing Sheet

PROCESS FOR INTERLEAVING NAVIGATION DATA

CROSS-REFERENCE TO RELATED APPLICATION

This application is related to co-pending application entitled "Data Interleaving Method and User Terminal," with Inventor Hans L. Trautenberg filed on even date herewith.

BACKGROUND AND SUMMARY OF THE INVENTION

This application claims the priority of German Application No. 102 19 701.6, filed May 2, 2002, the disclosure of which is expressly incorporated by reference herein.

The present invention is addressed to the transfer of navigation data from navigation transmission facilities to navigation terminals.

U.S. Pat. No. 6,101,178 describes a method for transferring navigation data to navigation terminals in which navigation is transmitted from several navigation data transmission facilities, here from navigation satellites and pseudolites, whereby an interleaving of navigation data of various navigation transmission facilities takes place with a TDMA method.

Such a method is only attained according to the state of the art in that the transmitted navigation data of different navigation data transmission facilities do not mutually disturb one another if possible. This method does not provide for optimization of data transmission to an individual navigation data transmitting facility.

The object of the present invention is to optimize transmission of navigation data from a navigation data transmission facility to navigation terminals.

The present invention provides a method for furnishing and transferring navigation data in a navigation system by transmission of several navigation data blocks from a navigation transmitting facility to navigation terminals. In accordance with the present invention, prior to transmitting navigation data to the navigation terminals, at least two navigation data blocks are interleaved. Basically, any type of distributing and regrouping data of the individual navigation blocks takes place as interleaving, whereby data of different navigation blocks are assembled into a new data packet. The advantage of interleaving is that the data of a data block can be distributed to several data packets, and thus the individual data of the data block can be separated in connection with a data transmission. If during a data transmission a data packet is erroneously transmitted, then not all data of a data block are lost, but rather only part of the data block. The lost part can then possibly be reconstructed on the basis of the remaining data of the data blocks which were transmitted in other data packets.

According to the invention either one or several or all navigation data sending facilities of the navigation system can be implement with such a method, and can also be correspondingly constructed.

The scope of the data with which an interleaving is conducted can be defined by the data content of a data frame (frame) which is ultimately transmitted to the navigation terminal. Generally such a data frame is at least defined by signalization data (headers) and useful data, whereby the signalization data at least contain identification data for identifying the data frame. The scope of the data with which an interleaving is conducted can, however, also be established for a specified transmission time for a navigation data block. A typical transmission time in satellite navigation systems for navigation data blocks which contain navigation reports is, for example, one second.

A transmission time can be established for interleaving, especially for each data unit of the navigation data block, with the aid of an algorithm, whereby the sequence of transmission times deviates from the original sequence of data units within the navigation data block. Thus, an emission of the individual data units of the navigation data blocks is brought about in which the sequence of the data units no longer corresponds to the original sequence of the data units in the navigation data blocks. The meaning of the data units is defined further below.

If there exists a case that at the same time in which a time-uncritical navigation data block is to be transmitted, k time-critical navigation data blocks are also to be sent with k=2, 3, 4 . . . then the algorithm can be constructed in such a way that, for transmitting the k time-critical navigation data blocks with k=2, 3, 4 . . . , and the one time-uncritical navigation data blocks, the transmission times of the data units of each time-critical navigation data block are at all times established in a fraction 1/k of the transmission time of the time-uncritical navigation data block. If, for example, a transmission time of one second is provided for a time-uncritical navigation data block and if at the same time 2 time-critical navigation blocks are to be sent, then the algorithm is constructed in such a way that the first time-critical report is transmitted in the first half of the transmission time, thus in the first ½ second, and the second time-critical time-critical report is transmitted in the second half of the transmission time, thus in the second ½ second. The meaning of time-critical and time-uncritical navigation blocks will be further defined below.

An advantage of this further development is that the time-critical navigation data blocks can be completely received in a fraction 1/k of the transmission time of the time-uncritical navigation data blocks and can be processed in the terminal. Also, a more rapid emission of the time-critical navigation data blocks can take place, since it is possible to begin with the emission of data after the first time-critical navigation data blocks are available because the second time-critical navigation data block must first be present in the second fraction 1/k of the transmission time. It is analogous with additional time-critical navigation data blocks.

The navigation data blocks can be distributed into equal packets with indexed data addresses to perform the interleaving. An interleaving can then take place by successive transmission of one data unit of a packet in any given case. Thus, for example, any desired first data unit of the first packet is transmitted after distributing the data of the navigation data blocks, then any desired first data unit of the second packet, then any desired first data unit of the third packet etc. up to the last packet can be transmitted. Then a second data unit of the first packet is transmitted, then a second data unit of the second packet etc. is transmitted up to the last packet. This process is continued up to the last data unit of each packet.

In the aforementioned example, one proceeds from an arbitrary succession of emission of data units per packet. But an emission of data units per packet corresponding to the indexing of the data addresses of the packet can also take place. It can, therefore, be provided that first the data units of all packets with the lowest or highest data address are transmitted successively and then the data units of all packets with the next highest or next lowest data address are successively transmitted. If one represents the packet in the form of columns one beside the other so that the totality of the packets forms a matrix, then this type of emission corresponds to a line by line emission of the data units of the packet.

Indexed data addresses mean are herein defined such that corresponding data addresses of individual data packets for the data transmission system are recognizable through the addresses, that is, that especially the beginning and the end of the data packets are ascertainable, and that a succession of data within the data packets is defined. The type of indexing and addressing can basically be freely chosen in a suitable manner.

A further development of the invention provides that at least a first group of packets is reserved for packets of navigation data blocks with time-critical navigation data and at least a second group of packets is reserved for packets for navigation data blocks with time-uncritical navigation data. Thus not all types of navigation data are evenly distributed to data packets, but there is a differentiation according to the significance of the navigation data, especially according to time-critical aspects. A differentiated treatment of time-critical and time-uncritical navigation data in the framework of interleaving becomes possible, which offers advantages for additional processing of navigation data, as will be explained further below. Those data that are to be understood as time-critical data must be transmitted immediately to the terminals for a secure operation or for certain applications in the navigation terminals. Typical periods of time here are under one second. Time-uncritical data in contrast are data which the terminal requires for operation or certain uses, but which can arrive with a certain delay in the terminal without the operation of the terminal being basically disturbed. The ratios of the numbers of the packets which are reserved for time-critical and time-uncritical are preferably determined by the ratio of the volumes of time-critical data to time-uncritical data. If the volume of time-critical data is a fourth or a half of the volume of time-uncritical data, then a fourth or half of the packets are reserved for time critical data, the rest for time uncritical data.

It can be provided that status reports are transmitted as time-critical data and navigation useful data are transmitted as time-uncritical navigation data, whereby the navigation useful data are used directly for determining the position on the part of the navigation terminal. Identification data of system components, data on the version of certain software or even traffic information for land, water or air traffic or other types of status information can also be transmitted as status information data.

Integrity reports concerning navigation data transmitting facilities of the navigation system represent an important type of status information. These can be subjected to an interleaving with further navigation data by an interleaving process of the invention. The transmission of the navigation data preferably takes place through a navigation satellite of a satellite navigation system. Reports on the specific integrity of the transmitting navigation satellite or on the integrity of a selected group of navigation satellites, or on the integrity of all navigation satellites of a satellite navigation system to which the transmitting navigation satellite belongs are transmitted as integrity reports. Alternatively or additionally, it can be provided that reports on the integrity of navigation satellites of other satellite navigation systems are transmitted as integrity reports.

In one method of interleaving of time-critical and time-uncritical data, it is provided that All packets have a length of n data units,
Packets of the first group of packets are filled with packets of n/k, k=2, 3, 4, 5 . . . data units of a navigation data block of time-critical material and
Packets of the second group of packets are filled with n data units of a navigation data block of time-uncritical data.

All data packets thus possess the same length. A bit, a byte or another defined data symbol with defined symbol length can be provided as a data unit. The packets of the second group are simply completely filled with time-uncritical data of the corresponding navigation data blocks. If the end of a navigation data block with time-uncritical material is reached, the filling of packets which are reserved for time-uncritical data is continued with the next navigation data block of time-uncritical data.

Time-critical data are nonetheless processed differently: Packets for time-critical data are not filled up to the full length n with the data of time-critical data blocks, but only n/k data units of a packet are filled with data of a certain data blocks, in the simplest case, only the first half of the packet. The data content of the data block with time-critical data is therewith distributed in each case up to the first half of several packets. This provides a particular advantage. By interleaving, the data contents of the packet are transmitted in such a way that first all data units which stand at the beginning of the packet are successively transmitted. This is continued until the end of the packet is reached. One can easily recognize that a data block that was in any case distributed to the first half of several parameters was already completely transmitted after half of the time that is necessary for transmission of all data of all packets. It is similar for the general case of n/k data units with k=2, 3, 4 . . . Hence time-critical data can be very rapidly completely transmitted and nonetheless be subjected to interleaving. The whole number k can basically be freely defined. It preferably corresponds, however, to the number of data blocks with time-critical data which must be transmitted within a certain time unit.

In a preferred embodiment, the volume of time critical data is at a maximum of half, ideally a maximum of a fourth of the volume of data of the time-uncritical data. In this way, the effectiveness of the process is assured.

A further object of the present invention is a satellite navigation system with navigation satellites which on the one hand have facilities for furnishing navigation data in the form of several navigation data blocks, and on the other hand have facilities for transmitting data to navigation terminals. According to the present invention, each navigation satellite has a facility for interleaving at least two navigation data blocks prior to the transmission of navigation data to the navigation terminals.

The facility for interleaving can be further developed so that it is suited for implementing individual or all steps of an interleaving process as described above. The facility for interleaving is then suitably adapted to the corresponding steps of the interleaving process.

A further object of the present invention is a user terminal for a satellite navigation system. In accordance with the invention, the user terminal has a device for reconstruction of navigation data blocks which have been received by the user terminal by a receiving unit of at least one navigation satellite and which were subjected to an interleaving according to a previously described method prior to receiving. The corresponding device of the user terminal is thus constructed for recognizing the navigation data in the form described above and reconstructing the original navigation data blocks again on the basis of the original data through a de-interleaving complementary to the interleaving.

A further object of the present invention is a computer program for processing navigation data of a satellite navigation system which have been subjected to an interleaving according to one of the previously described methods, whereby the computer program is constructed for a cooperation with the facilities of an aforementioned user terminal. The computer program hence recognizes and processes the navigation data in the form described above and is able to reconstruct the original navigation data blocks again by a de-interleaving complementary to the interleaving.

A further object of the present invention is a computer program product includes a machine-readable program carrier on which an aforementioned computer program is stored in the form of electronically readable control signals, whereby the computer program product is constructed for interacting with a user terminal. The control signals can be stored in any suitable form. The electronic reading out can then correspondingly take place through electrical, magnetic, electromagnetic, electro-optical or other electronic methods. Examples for such program carriers are magnetic tapes, diskettes, hard disks, CD-ROM or semiconductor components.

Other objects, advantages and novel features of the present invention will become apparent from the following detailed description of the invention when considered in conjunction with the accompanying drawings.

BRIEF DESCRIPTION OF THE DRAWING

A special design will be explained below on the basis of the sole FIGURE which is a schematic representation of a satellite navigation system.

DETAILED DESCRIPTION OF THE PREFERRED EMBODIMENTS

Figure 1:
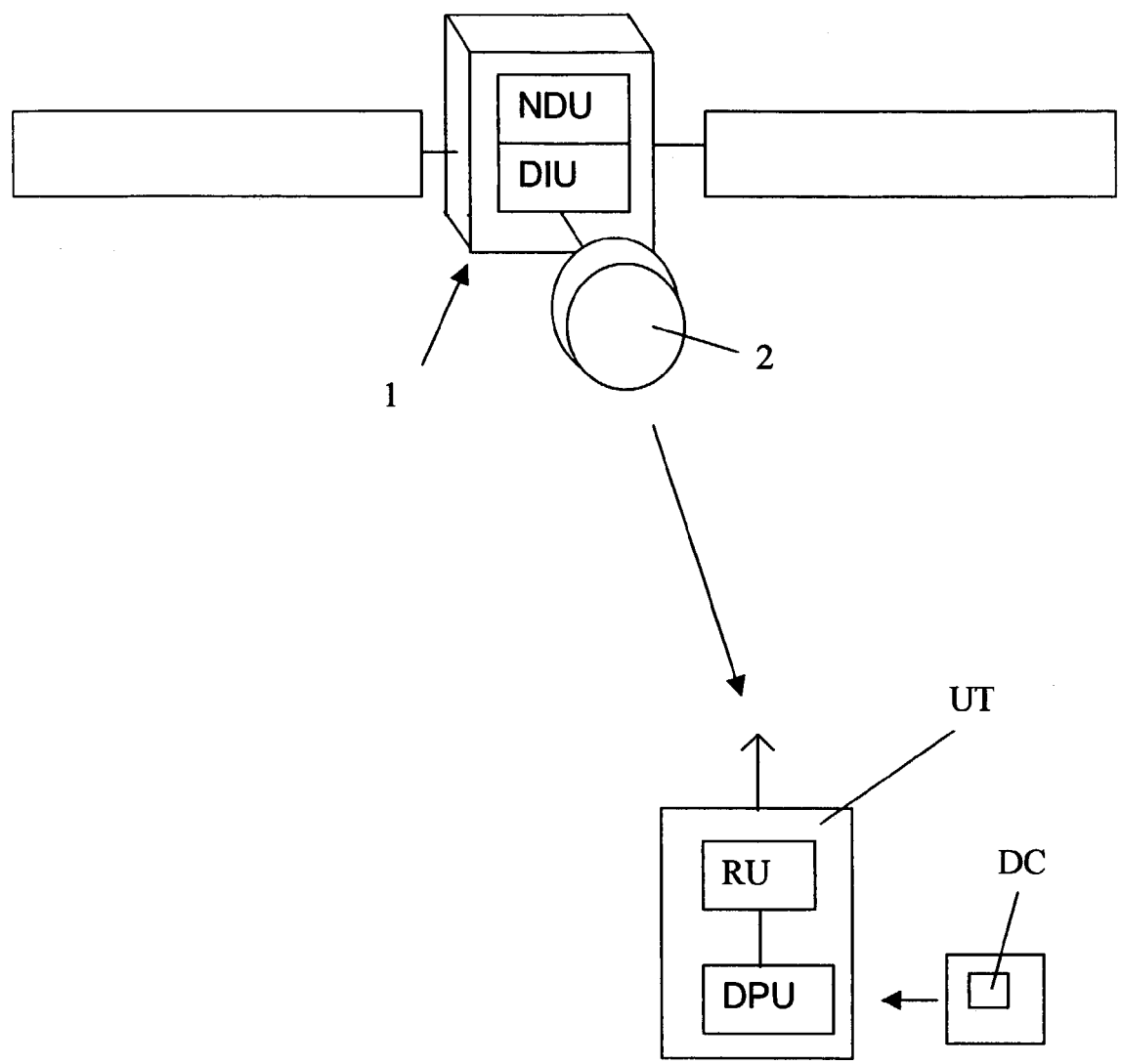

A satellite navigation system is schematically represented in the FIGURE. A navigation satellite 1 has an NDU (Navigation Data Unit) facility for furnishing navigation data blocks. Two types of navigation data blocks are to be considered: Navigation reports and integrity reports. This will be explained in greater detail on the basis of the tables. The navigation satellite 1 furthermore has a DIU (Data Interleaving Unit) facility for interleaving navigation data blocks. This interleaving of the navigation data blocks takes place before a transmission of the data to a UT (User Terminal) takes place. The navigation satellite 1 has a transmission facility 2 for transmitting data. The user terminal UT has a receiving facility RU (Receive Unit) and a DPU (Data Processing Unit) facility for reconstructing navigation data blocks on the basis of the data received.

The following are examples of navigation data blocks:
 a navigation report N with a length of 96 data units or symbols B1, B2, B3, B4 . . . , B96, which contain data on the basis of which a terminal UT can directly determine its position;
 an integrity report A with a length of 12 or 24 data units or symbols A1, A2, A3, . . . A12 or A1, A2, A3, . . . A24
 an integrity report B with a length of 12 or 24 data units or symbols B3, B2, B3, . . . B12 or B1, B2, B3, . . . B24.

Of course, other suitable types of time-critical status reports can also be provided instead of integrity reports.

The transmission of integrity reports in satellite navigation systems is clearly more time-critical than the transmission of navigation reports whose content only changes slowly over time. Moreover, the integrity reports are significantly shorter than the navigation reports.

Each of the three reports N, A, B forms a navigation data block. The individual data units of the navigation data blocks are distributed by the DIU facility for interleaving to packets a, b, c, . . . of length l=12, as tables 1 and 2 illustrate. The packets a, b, c . . . are here represented in the form of columns. The interleaving takes place by a transmission of the data units in line direction of Table 1 or Table 2. Thus, an interleaving is realized in that first all data units are transmitted successively whose data address has the lowest index, hence a0, b0, c0, d0 . . . Then follows the transmission of the next row a1, b1, c1, d1 . . . and so forth until the transmission of the last series a11, b11, c11, d11 . . . . As one easily recognizes, the individual data units of the individual navigation blocks are in this way transmitted separately from one another. In Tables 1 and 2, the separation is m=8 data units for the data of the integrity reports.

As one likewise will recognize on the basis of Tables 1 and 2, not all packets are evenly filled with data of arbitrary navigation data blocks. A part of the packets, namely in the case of Table 1, the packets c, f, i, l and in the case of Table 2, the packets c, h are reserved for data of the integrity reports A, B. The remaining packets are reserved for data of the navigation reports. The number of packets reserved for integrity reports are defined by the ratio of the volume of data of the integrity reports to the volume of data of the navigation report.

If the reports A, B possess a length of 12 data units, then the ratio is 2*12:96=1:4, that is, that the ratio the number of the packets for integrity reports/number of packets for navigation report is selected equal to 1:4, as Table 2 shows.

If the reports A, B possess a length of 24 data units, then the ratio is 2*24:96=1:2, that is the ratio of the number of packets for integrity reports/number of packets for navigation report is likewise selected equal to 1:2, as Table 1 shows.

The packets which are reserved for the navigation report are continuously filled with data units N1, N2, N3 . . . . If a packet a is completely filled, then filling continues with the next packet b until all packets which are reserved for the navigation report N are filled with data of the navigation report N.

The packets which are reserved for the integrity reports A, B are nonetheless filled in another manner. Each packet is filled only with n/k data units, whereby n represents the length of the packet and k represents an integer k=2, 3, 4. In particular, k can represent the number of integrity reports to be transmitted in the framework of the current packets, here k=2. Consequently, each correspondingly reserved packet is only filled with 12/2=6 data units of an integrity report, beginning from the beginning c0 of the packet. If the reserved packets are half filled with data of integrity report A, then the remaining half is filled with the data of integrity report B, beginning at data address c6.

Subsequently an interleaving for data transmission takes place through all packets a, b, c, d . . . as already described above. An advantage of the method described here is that the integrity report A can be completely received from the user terminal UT after half of the time which is necessary to transmit all packets a, b, c, completely. This is possible due to the here described distribution of the integrity reports to the packets and the subsequent line by line transmission of the packets, since after the first six lines are transmitted with the indices 0, 1, 2, 3, 4, 5, the integrity report is completely transmitted.

In this way, it is guaranteed that precisely time-critical data are transmitted as rapidly as possible to the user terminal UT and that nonetheless an interleaving takes place with sufficient separation.

TABLE 1 for m = 8, n = 12, k = 2 and l = 24:

| a | b | c | d | E | f | g | h | i | j | k | l |
|---|---|---|---|---|---|---|---|---|---|---|---|
| 11 | N12 | N24 | B6 | N36 | N48 | B12 | N60 | N72 | B18 | N84 | N96 | B24 |
| 10 | N11 | N23 | B5 | N35 | N47 | B11 | N59 | N71 | B17 | N83 | N95 | B23 |
| 9 | N10 | N22 | B4 | N34 | N46 | B10 | N58 | N70 | B16 | N82 | N94 | B22 |
| 8 | N9 | N21 | B3 | N33 | N45 | B9 | N57 | N69 | B15 | N81 | N93 | B21 |
| 7 | N8 | N20 | B2 | N32 | N44 | B8 | N56 | N68 | B14 | N80 | N92 | B20 |
| 6 | N7 | N19 | B1 | N31 | N43 | B7 | N55 | N67 | B13 | N79 | N91 | B19 |
| 5 | N6 | N18 | A6 | N30 | N42 | A12 | N54 | N66 | A18 | N78 | N90 | A24 |
| 4 | N5 | N17 | A5 | N29 | N41 | A11 | N53 | N65 | A17 | N77 | N89 | A23 |
| 3 | N4 | N16 | A4 | N28 | N40 | A10 | N52 | N64 | A16 | N76 | N88 | A22 |
| 2 | N3 | N15 | A3 | N27 | N39 | A9 | N51 | N63 | A15 | N75 | N87 | A21 |
| 1 | N2 | N14 | A2 | N26 | N38 | A8 | N50 | N62 | A14 | N74 | N86 | A20 |
| 0 | N1 | N13 | A1 | N25 | N37 | A7 | N49 | N61 | A13 | N73 | N85 | A19 |

TABLE 2 for m = 8, n = 12, k = 2 and l = 12:

| a | b | c | d | e | f | g | h | i | j |
|---|---|---|---|---|---|---|---|---|---|
| 11 | N12 | N24 | B6 | N36 | N48 | N60 | N72 | B12 | N84 | N96 |
| 10 | N11 | N23 | B5 | N35 | N47 | N59 | N71 | B11 | N83 | N95 |
| 9 | N10 | N22 | B4 | N34 | N46 | N58 | N70 | B10 | N82 | N94 |
| 8 | N9 | N21 | B3 | N33 | N45 | N57 | N69 | B9 | N81 | N93 |
| 7 | N8 | N20 | B2 | N32 | N44 | N56 | N68 | B8 | N80 | N92 |
| 6 | N7 | N19 | B1 | N31 | N43 | N55 | N67 | B7 | N79 | N91 |
| 5 | N6 | N18 | A6 | N30 | N42 | N54 | N66 | A12 | N78 | N90 |
| 4 | N5 | N17 | A5 | N29 | N41 | N53 | N65 | A11 | N77 | N89 |
| 3 | N4 | N16 | A4 | N28 | N40 | N52 | N64 | A10 | N76 | N88 |
| 2 | N3 | N15 | A3 | N27 | N39 | N51 | N63 | A9 | N75 | N87 |
| 1 | N2 | N14 | A2 | N26 | N38 | N50 | N62 | A8 | N74 | N86 |
| 0 | N1 | N13 | A1 | N25 | N37 | N49 | N61 | A7 | N73 | N85 |

This special class of examples can generally be represented as follows:

Assume that a navigation report, thus a long report with a length of n×m data units or symbols is to be transmitted once a second, and k integrity reports, thus short reports, with a length of l data units or symbols are to be transmitted each second. If one can find integers i, j and p, so that the following applies: k×l=i×n, k×j=n, and m=i×(p−1), then a distribution of navigation data to packets can take place in each case as they were shown in Tables 1 and 2 by way of example.

Then an interleaving of the matrix can take place which is formed by the packets and which possesses (k×l/n+m) columns and n lines, whereby each m×n/k×l-th column is reserved for integrity reports, hence for short reports.

The m columns or packets which are reserved for the data of the navigation report (hence for the long report) are filled with data column by column and therewith packet by packet. In contrast, in filling the columns or packets reserved for integrity reports (thus for short reports), the column is changed after every n/k-th symbol. Then line by line transmission of the matrix to the user terminal UT takes place, through which the entirety of the data is transmitted and at the same time, an interleaving takes place.

This results in the following:
1. A long report can be completely de-interleaved in the user terminal UT after k×l+m×n symbols have been received.
2. A short report can nonetheless be completely de-interleaved after l+m×n/k symbols have been received by the user terminal.
3. The separation of successive symbols of the short report comes to min (k×l/n+m, n/k+m×n/k×l) symbols.
4. The separation of successive symbols of the long report amounts to n symbols.

An advantage of this method is that the short reports can be completely de-interleaved k times per second and nonetheless there exists a sufficient separation between consecutive symbols of the short reports.

To the extent that no integers i, j and p can be found for which k×l=i×n, k×j=n and m=i×(p−1) applies, the same process as above can basically be implemented, but then (int(k×l/n)+l+m) columns or packets are needed if an as even and sufficient separation as possible is to continue to exist between consecutive symbols of the short reports. It can then also be provided that individual data addresses of the packets or columns are filled with filler data units or filler bits in order to once again attain a complete filling of an entire matrix with data analogously to Tables 1 and 2, and thus to compensate for deviations in the length of the reports from the desired length analogously to Tables 1 and 2.

If one now considers the user terminal UT, this device can be set up for reconstruction of the navigation data blocks of the satellite navigation system, especially with the aid of a computer program, if the other hardware preconditions exist in the user terminal UT. The computer program then makes possible the recognition and processing of the data packets of integrity reports A, B and of navigation reports N, in particular in interaction with the data processing device DPU. The original integrity reports A, B and navigation reports N can be completely reconstructed with the aid of the computer program on the basis of the data received which have run through an interleaving by a complementary de-interleaving.

The computer program can be installed in the user terminal UT preferably with the aid of a computer program product, whereby the computer program product includes a machine-readable program carrier (Data Carrier) DC on which the computer program is stored in the form of electronically readable control signals. An example is a chip card with a semiconductor chip in which the computer program is stored. But all other suitable types of computer program products are also usable.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A process for providing and transmitting navigation data in a satellite navigation system, comprising providing a plurality of navigation data blocks;
   interleaving of at least two of said plurality of navigation data blocks;
   subsequent to of interleaving, transmitting said plurality of navigation data blocks by a navigation satellite to navigation terminals; and
   establishing a transmission time for interleaving each data unit of each of said plurality of data blocks with an algorithm wherein a succession of transmission times deviates from the original sequence of the data units within the navigation data block.

2. The process according to claim 1, wherein the algorithm is constructed in such a way that, for transmission of k time-critical navigation blocks with k=2, 3, 4, . . . and of a time-uncritical navigation data block, the transmission times of the data units of each time-critical navigation data block is established in each case as a fraction 1/k of the transmission time of the time-uncritical navigation data block.

3. The process according to claim 1, wherein the navigation data blocks are distributed into identical packets with indexed data addresses and an interleaving takes place by successive transmission of a data unit of a packet in each case.

4. The process according to claim 3, wherein first the data units of all packets with the lowest and the highest data address are consecutively transmitted and then the data units of all packets with the next higher or next lower data address are successively transmitted.

5. The process according to claim 3, wherein at least a first group of packets is reserved for navigation data blocks with time-critical navigation data and at least a second group of packets of navigation data blocks is reserved for navigation data blocks with time-uncritical navigation data.

6. The process according to claim 2, wherein status reports are transmitted as time-critical data and that navigation useful data are transmitted as time-uncritical navigation data.

7. The process according to claim 6, wherein integrity reports concerning navigation data transmitting facilities of the navigation system are transmitted as status reports.

8. The process according to claim 7, wherein the transmission of navigation data by the navigation satellite takes place, and in reports on the specific integrity of the transmitting navigation satellite, or on the integrity of a selected group of navigation satellites or on the integrity of all navigation satellites of a satellite navigation system to which the navigation satellite belongs are transmitted.

9. The process according to claim 7, wherein alternatively or additionally, reports on the integrity of navigation satellites of other satellite navigation systems are transmitted as integrity reports.

10. The process according to claim 3, wherein
    all packets have a length of n data units,
    packets of the first group of packets are filled with n/k, k2, 3, 4, 5, . . . data units of a navigation block of time-critical data and
    packets of the second group of packets are filled with n data units of a navigation block of time-uncritical data.

11. The process according to claim 2, wherein a volume of time-critical data at a maximum is half of the volume of time-uncritical data.

12. The process according to claim 11, wherein a volume of time-critical data at a maximum amounts to a fourth of the volume of time-uncritical data.

13. A satellite navigation system having a plurality of navigation satellites with (NDU) facilities for furnishing navigation data in the form of a plurality of navigation data blocks and facilities for transmitting data to navigation terminals (UT), wherein each of said plurality of navigation satellites includes a (DIU) facility for interleaving at least two navigation data blocks prior to transmission of the at least two navigation data to said navigation terminals (UT).

14. The satellite navigation system according to claim 13, wherein the (DIU) facility for interleaving is configured to operate by
    providing a plurality of navigation data blocks;
    interleaving of at least two of said plurality of navigation data blocks;
    subsequent to interleaving, transmitting said plurality of navigation data blocks by a navigation satellite to navigation terminals; and
    establishing a transmission time for interleaving each data unit of each of said plurality of data blocks with an algorithm wherein a succession of transmission times deviates from the original sequence of the data units within the navigation data block.

15. A user terminal (UT) for a satellite navigation system comprising a (DPU) facility for reconstructing navigation data blocks received by a receiving unit (RU) of at least one navigation satellite and subjected to an interleaving prior to receiving said navigation data blocks wherein a transmission time for interleaving data units of said navigation data blocks is established such that a succession of transmission times deviates from an original sequence of said data units with each of said navigation blocks.

16. A computer-readable medium encoded with computer executable instructions for processing navigation data of a satellite navigation system subjected to an interleaving, the instructions comprising a process for
    providing a plurality of navigation data blocks;
    interleaving of at least two of said plurality of navigation data blocks;
    subsequent to of interleaving, transmitting said plurality of navigation data blocks by a navigation satellite to navigation terminals; and
    establishing a transmission time for interleaving each data unit of each of said plurality of data blocks with an algorithm wherein a succession of transmission times deviates from the original sequence of the data units within the navigation data block;
    the computer-readable medium being arranged to interact with (DPU) facilities of a user terminal (UT) for reconstructing navigation data blocks that are received from the user terminal by a receiving unit (RU) of at least one navigation satellite and that are subjected to said interleaving prior to receiving said navigation.

17. A computer-readable medium according to claim 16, wherein the computer-executable instructions are stored in the form of electronically readable control signals, whereby the computer program product is constructed for and provides interaction with the user terminal (UT).

* * * * *